United States Patent [19]

Koide et al.

[11] Patent Number: 5,038,056
[45] Date of Patent: Aug. 6, 1991

[54] OUTPUT CIRCUIT

[75] Inventors: Kazuo Koide, Tokyo; Mikio Yamagishi, Ohme, both of Japan; Kazutaka Mori, Princeton, N.J.

[73] Assignee: Hitachi, Ltd., Tokyo, Japan

[21] Appl. No.: 515,683

[22] Filed: Apr. 26, 1990

Related U.S. Application Data

[63] Continuation of Ser. No. 156,828, Feb. 17, 1988, abandoned.

[30] Foreign Application Priority Data

Feb. 25, 1987 [JP] Japan .................................. 62-40280
Apr. 8, 1987 [JP] Japan .................................. 62-84706

[51] Int. Cl.$^5$ ...................... H03K 17/16; H03K 19/02
[52] U.S. Cl. .................................... 307/448; 307/451; 307/452; 307/463; 307/473
[58] Field of Search ............... 307/443, 448, 451, 473, 307/452, 463, 546

[56] References Cited

U.S. PATENT DOCUMENTS

| | | | |
|---|---|---|---|
| 4,490,633 | 12/1984 | Noufer et al. | 307/443 |
| 4,638,187 | 1/1987 | Boler et al. | 307/443 |
| 4,760,283 | 7/1988 | Weaver | 307/546 |
| 4,777,389 | 10/1988 | Wu et al. | 307/451 |

OTHER PUBLICATIONS

"MOS integrated circuits", pp. 246-249, Robert E. Krieger Publishing Company.

Primary Examiner—Stanley D. Miller
Assistant Examiner—Margaret R. Wambach
Attorney, Agent, or Firm—Antonelli, Terry, Stout & Kraus

[57] ABSTRACT

In order to reduce undesirable output noise, an output circuit is provided which includes a first output MOSFET which is interposed between an output terminal and a first power source voltage, and a second output MOSFET which is interposed between the output terminal and a second power source voltage. In particular, in accordance with one aspect of the invention, a feedback circuit is interposed between the output terminal and the gate of the first output MOSFET or/and between the output terminal and the gate of the second output MOSFET to negatively feedback voltage to provide a gentle level change for the output voltage. In other embodiments, a short-circuit arrangement is provided which is interposed between the gate and source of the first output MOSFET or/and between the gate and source of the second output MOSFET. The short-circuit arrangement is temporarily held in a transferring state at the initial stage of a process in which the corresponding first or second output MOSFET is turned on to provide the desired gentle level change.

23 Claims, 7 Drawing Sheets

OUTPUT CIRCUIT

This application is a continuation of application Ser. No. 156,828, filed on Feb. 17, 1988, now abandoned.

BACKGROUND OF THE INVENTION

This invention relates to an output circuit (output buffer). More particularly, it relates to a technique which is especially effective when applied to, for example, a plurality of output circuits that are disposed in a digital processor constructed of a gate-array integrated circuit and that are simultaneously brought into operating states in accordance with predetermined timing signals.

In the art, there are known gate-array integrated circuits which include a plurality of output circuits adapted to be simultaneously brought into operating states, and which construct a digital processor such as computer. In addition, push-pull output circuits for such output circuits are described in, for example, "MOS INTEGRATED CIRCUITS," pp. 246-249, issued by Robert E. Krieger Publishing Company, U.S., in 1979.

Shown in FIG. 11 is a circuit diagram of an example of a tri-state output circuit studied by the inventors prior to the present invention. This circuit employs the aforementioned push-pull output circuit. This output circuit includes (n+1) data output buffers DOB-0-DOBn which are simultaneously brought into operating states in accordance with an output control signal $\phi oe$ by way of example, and an output buffer OBc which serves to deliver a sequence control signal CTa. Each of the output buffers includes output MOSFET's Q21 and Q22 of the N-channel type which are connected in series form between the power source voltage Vcc and ground potential of the circuitry. The gates of the output MOSFET's Q21 and Q22 of each output buffer are respectively supplied with internal signals which are selectively formed according to the output control signal $\phi oe$ and a corresponding one of inverted internal output signals Do0 $-\overline{\text{Don}}$. Thus, when the output control signal $\phi oe$ is set at a high level and the corresponding one of the inverted internal output signals Do0-$\overline{\text{Don}}$ is set at a low level of logic "1," the output MOSFET Q21 is selectively brought into its "on" state and delivers an output signal of high level to a corresponding one of output terminals. On this occasion, the output MOSFET Q21 constitutes a source-follower circuit whose load is the output MOSFET Q22. On the other hand, when the output control signal $\phi oe$ is set at the high level and the corresponding one of the inverted internal output signal Do0-$\overline{\text{Don}}$ is set at a high level of logic "0," the output MOSFET Q22 is selectively brought into its "on" state and delivers an output signal of low level to the corresponding one of the output terminals. On this occasion, the output MOSFET Q22 constitutes a source-grounded amplifier circuit whose load is the output MOSFET Q21.

Meanwhile, in the output buffer OBc, a NOR gate circuit NOG9 and a NAND gate circuit NAG7 are normally held in their transferring states. Therefore, the output MOSFET's Q21 and Q22 of the output buffer OBc selectively deliver the sequence control signal CTa of low level or high level from an output terminal CTa in accordance with an inverted internal output signal $\overline{\text{Co}}$. This sequence control signal CTa is used for, e.g., selecting the next instruction step of the digital processor.

The output buffers DOB0-DOBn and OBc have resistive, inductive and capacitive loads coupled to the output signal lines thereof through the output terminals D0-Dn and CTa. In addition, these output buffers are supplied with the ground potential of the circuitry through a ground potential feed line GND, to which a resistive load Rs, an inductive load Ls, etc. similar to the above are coupled. Further, the digital processor or the like including these output buffers has the tendency that, as the operating speed thereof is raised, the size of each output MOSFET is enlarged to lower the conductance, namely, the "on" resistance thereof, to thus heighten the driving ability thereof.

For this reason, in a case where, by way of example, a plurality of data output buffers are simultaneously brought into the operating states to turn "on" a plurality of output MOSFET's all together, a sudden change in current arises on a power source voltage feed line or the ground potential feed line GND. This change is conspicuous, for example, when the output signals of logic "0" or low level are delivered from all the data output buffers. As illustrated in FIG. 12, the change develops power source noise of comparatively large magnitude ascribable to the parasitic inductance Ls, etc. on the ground potential feed line GND. More specifically, when the output MOSFET's Q21 of the data output buffers DOB0-DOBn are turned "on" all together, the load capacitances coupled to the respective output signal lines are discharged all at once, and the resulting discharge currents flow to the ground potential feed line GND. On this occasion, the output MOSFET's Q21 of the respective data output buffers are brought into stable "on" states because the gate-source voltages thereof are rendered substantially constant irrespective of the drain voltages thereof. Accordingly, the ground potential feed line GND undergoes the following noise:

$$\Delta V = Ls \times Ig/\Delta t$$

where Ls denotes the parasitic inductance thereof, and Ig denotes the discharge currents. This noise of the ground potential feed line GND further develops noise exceeding the maximum specification $V_{OL}$ of the low-level output signal in, for example, the low-level sequence control signal CTa which is delivered from the output buffer OBc arranged near the data output buffers DOB0-DOBn. In consequence, an instruction control operation in the instruction control circuit of the digital processor or the like is caused to err, and the malfunction of the whole processor is incurred.

In order to cope with this drawback, the inventors considered the addition of Miller capacitors C as indicated by dotted lines in FIG. 11, before the present invention. As an experimental result, however, an abnormal peak appeared in the output signal level due to the Miller capacitor as indicated by a dotted line in FIG. 12. Besides, because the Miller capacitors must be of comparatively large size, the layout efficiency of the output circuit lowered, and the high-density integration thereof was hampered.

The solution of the problems of the output circuits as stated above is required especially for gate-array integrated circuits etc. which need to be standardized and in each of which a power source voltage feed line and a ground potential feed line cannot be laid in a functionally-divided fashion.

SUMMARY OF THE INVENTION

An object of this invention is to provide an output circuit which can reduce noise without lowering the layout efficiency thereof. Another object of this invention is to suppress the level of noise which develops on the power source voltage feed line and ground potential feed line of a digital processor or the like including a plurality of output circuits that are simultaneously brought into operating states, thereby to prevent the malfunction of the digital processor or the like.

The above and other objects and novel features of this invention will become apparent from the description of the specification and the accompanying drawings.

A typical aspect of performance of the present invention is briefly summarized as follows: Across the output terminal of an output circuit and the gate of an output MOSFET which is interposed between the output terminal and the power source voltage of circuitry or/and the ground potential of the circuitry, there is formed a feedback path that is temporarily brought into a transferring state at the initial stage of a process in which the corresponding output MOSFET is turned "on," or across the gate and source of the output MOSFET, there is formed a short-circuiter that is temporarily brought into a transferring state at the initial stage of a process in which the output MOSFET is turned "on."

According to the above expedient, the gain of an output amplifier circuit which is basically constructed of the output MOSFET can be temporarily lowered at the initial stage of the process in which the output MOSFET is turned "on," so that a level change at the time of the rise or fall of an output signal can be made gentle. Thus, the level of noise to develop on a power source voltage feed line or a ground potential feed line can be suppressed, and the malfunction of a digital processor or the like including the output circuit can be prevented.

DESCRIPTION OF THE PREFERRED EMBODIMENTS

Example 1

Figure 1:
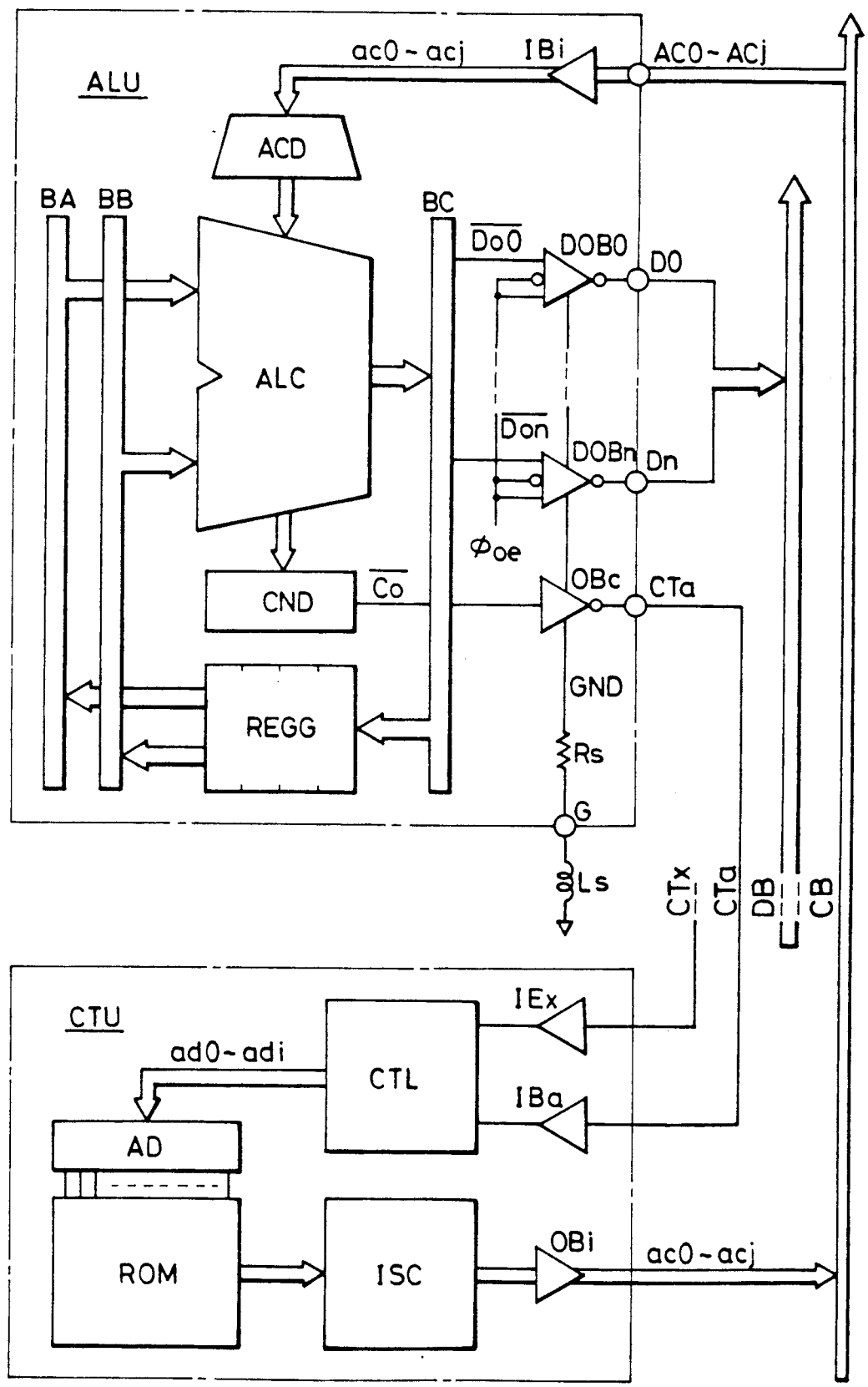
FIG. 1 is a block diagram showing an embodiment of a digital processor that includes output circuits to which this invention is applied.

Shown in FIG. 1 is a block diagram of an embodiment of a digital processor including output circuits to which this invention is applied. Though not especially restricted, the digital processor of this embodiment includes a plurality of units which are mounted on a common packaging board. Among them, an arithmetic/logic unit ALU and an instruction control unit CTU are exemplified in FIG. 1. Though not especially restricted, these units are arranged by adding optional designs to a standard gate-array integrated circuit. Though no special restriction is intended, the output circuits to which this invention is applied are included in the arithmetic/logic unit ALU of the digital processor. Incidentally, the circuit elements of the gate-array integrated circuit constituting the arithmetic/logic unit ALU and the instruction control unit CTU are respectively formed on individual semiconductor substrates of, e.g., single-crystal silicon though this is not especially restrictive. In addition, the respective units constituting the digital processor are coupled through the external terminals of the corresponding semiconductor substrates and buses (signal bus bars) formed on the packaging board. Thus, this digital processor functions as a monolithic processor which adopts a stored program system.

Referring to FIG. 1, the arithmetic/logic unit ALU is basically constructed of an arithmetic/logic circuit ALC. The arithmetic/logic circuit ALC includes various logical-operation circuits, and though not especially restricted, the operation mode thereof is designated by arithmetic or operation codes ac0–acj of (j + 1) bits which are supplied thereto from the instruction control unit CTU through a control bus CB as well as an input buffer IBi. The operation codes ac0–acj are decoded by an arithmetic or operation code decoder ACD. As a result, a corresponding operation mode signal is supplied to the arithmetic/logic circuit ALC.

One input terminal of the arithmetic/logic circuit ALC is supplied with first operation data from a designated register in a register group REGG and through an internal bus BA, while the other input terminal is supplied with second operation data from another register in the register group REGG and through an internal bus BB. The arithmetic/logic circuit ALC subjects these operation data items to a predetermined operation process conforming to the operation mode signal. The output signal of the arithmetic/logic circuit ALC is transmitted through an internal bus BC to a predetermined register in the register group REGG, and is held therein.

Meanwhile, the carry flag, sign bit etc. of the arithmetic/logic circuit ALC are supplied to a condition decision circuit CND though this is not especially restrictive. The condition decision circuit CND forms an inverted internal output signal $\overline{Co}$ in accordance with the carry flag, the sign bit, etc. This inverted internal output signal $\overline{Co}$ is transmitted as a sequence control signal CTa to the instruction control unit CTU through an output buffer OBc. As will be described later, the instruction control unit CTU determines the address of an instruction to be executed next, in accordance with the sequence control signal CTa and respective sequence control signals supplied from other units.

When the arithmetic/logic unit ALU is brought into the predetermined operation mode, the operated result thereof is sent from the internal bus BC to a data bus DB through data output buffers DOB0-DOBn. The data items are transmitted to the other unit, not shown, of the digital processor through the data bus DB. On this occasion, the data output buffers DOB0-DOBn are respectively supplied with inverted internal output signals Do0-$\overline{\text{Don}}$ formed according to the operated result, though this is not especially restrictive. In addition, the data output buffers DOB0-DOBn are selectively brought into operating states in accordance with an output control signal $\phi$oe which is supplied from the timing generator circuit, not shown, of the arithmetic/logic unit ALU. The arithmetic/logic unit ALU is provided with a plurality of output buffers including the data output buffers DOB0-DOBn and the output buffer OBc. These output buffers are supplied with the ground potential (second power source voltage) of the circuitry through a common external terminal G and a ground potential feed line GND.

Though not especially restricted, the instruction control unit CTU includes a control circuit CTL, an instruction sequence control circuit ICS and a read-only memory ROM. Among them, the read-only memory ROM stores a series of programs for controlling the operation of the digital processor. Each of these programs are constructed of a plurality of instructions stored in the respective addresses of the read-only memory ROM.

Though not especially restricted, the control circuit CTL of the instruction control unit CTU is supplied with a plurality of sequence control signals CTa-CTx from the respective units of the digital processor and through corresponding input buffers IBa-IBx. In accordance with these sequence control signals, the control circuit CTL determines the address of the next instruction which the digital processor is to execute, and the determined address is supplied to an address decoder AD as address signals ad0-adi of (i + 1) bits.

The address decoder AD decodes the address signals ad0-adi, and brings the corresponding address of the read-only memory ROM into a selected state. As a result, the single instruction is read out from the designated address of the read-only memory ROM and is transmitted to the instruction sequence control circuit ICS.

The instruction sequence control circuit INS decodes part of the instruction supplied from the read-only memory ROM, and starts the corresponding unit of the digital processor. In a case where the instruction read out from the read-only memory ROM is any of various operation or arithmetic instructions, the instruction sequence control circuit ICS forms the operation codes ac0-acj on the basis of the instruction and supplies them to the arithmetic/logic unit ALU through an output buffer OBi.

Figure 2:
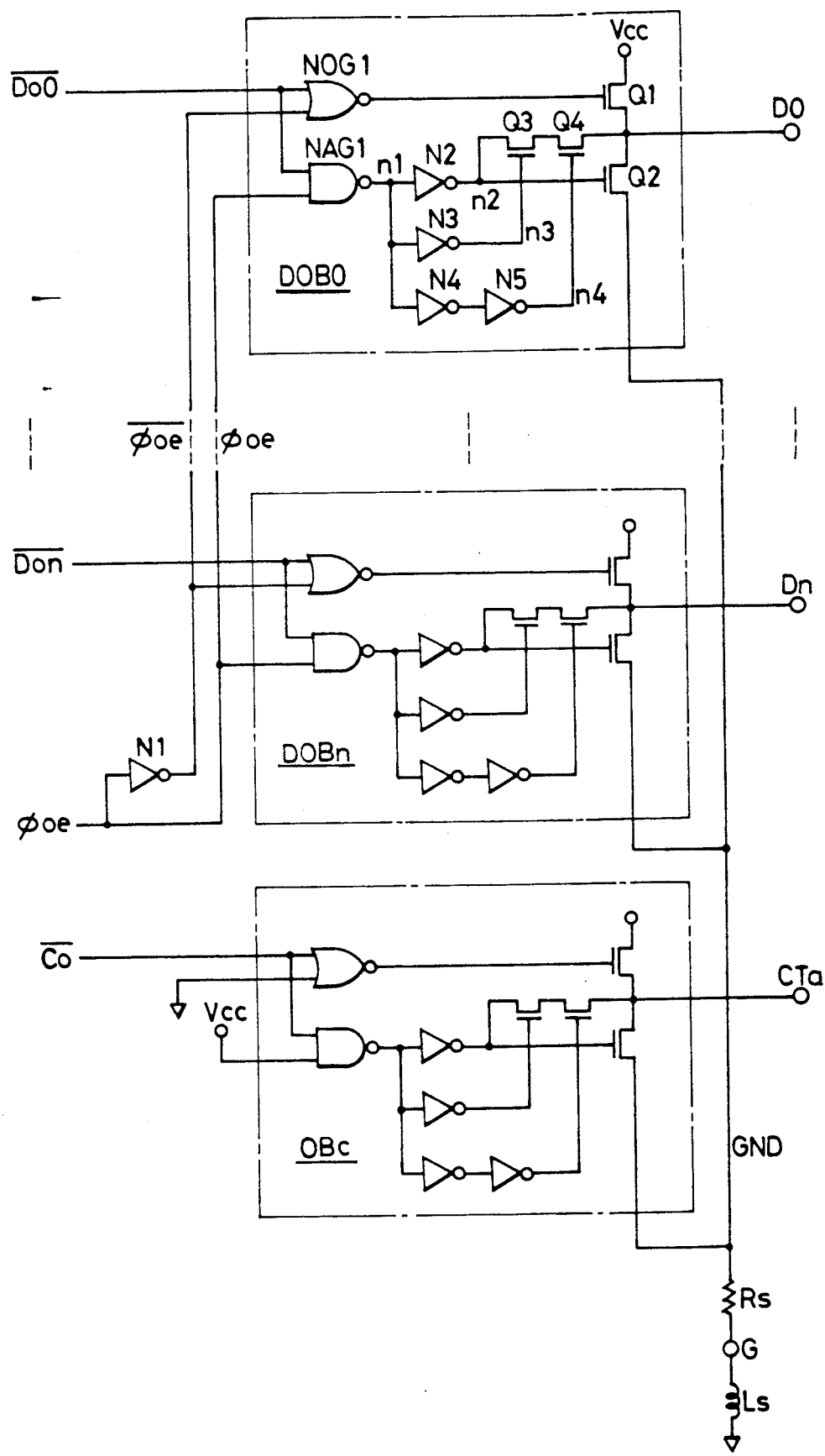
FIG. 2 is a circuit diagram showing an embodiment of the output circuit to which this invention is applied.

FIG. 2 shows a circuit diagram of an embodiment of the data output buffers DOB0-DOBn and output buffer OBc of the arithmetic/logic unit ALU of the digital processor in FIG. 1. In FIG. 2 et seq., a MOSFET whose channel (back gate) portion has an arrow affixed thereto is of the P-channel type and is indicated in distinction from an N-channel MOSFET to which no arrow is affixed.

As stated before, the arithmetic/logic unit ALU of this embodiment includes the (n + 1) data output buffers DOB0-DOBn and the output buffer OBc for the sequence control signal CTa. Among them, the data output buffers DOB0-DOBn are respectively supplied with the corresponding inverted internal output signal Do0-$\overline{\text{Don}}$ from the arithmetic/logic circuit ALC and through the internal bus BC. The data output buffers DOB0-DOBn are selectively brought into operating states in accordance with the output control signal $\phi$oe supplied from the timing generator circuit, not shown, of the arithmetic/logic unit ALU, and they deliver the output signals conforming to the corresponding inverted internal output signals Do0-$\overline{\text{Don}}$, to the data bus DB through respective data output terminals D0-Dn.

Referring to FIG. 2, the output control signal $\phi$oe is supplied to one input terminal of each of the NAND gate circuits NAG1 of the data output buffers DOB0-DOBn in common though this is not especially restrictive. In addition, after the output control signal $\phi$oe is inverted by an inverter circuit N1, the inverted signal $\overline{\phi\text{oe}}$ is supplied to one input terminal of each of the NOR gate circuits NOG1 of the data output buffers DOB0-DOBn in common.

The other input terminals of the NOR gate circuit NOG1 and NAND gate circuit NAG1 of each of the data output buffers DOB0-DOBn are connected in common, and are supplied with the corresponding one of the inverted internal output signals Do0-$\overline{\text{Don}}$. These inverted internal output signals Do0-$\overline{\text{Don}}$ are set at a high level when data to be output is of logic "0," whereas they are set at a low level when it is of logic "1."

Thus, the output signals of the NOR gates NOG1 of the respective data output buffers DOB0-DOBn are selectively brought to the high level in a case where the output control signal $\phi$oe is rendered the high level, that is, the output signal of the inverter circuit N1 is rendered the low level, and where the corresponding inverted internal output signals Do0-$\overline{\text{Don}}$ are rendered the logic "1," namely, the low level. In addition, the output signals of the NAND gates NAG1 of the respective data output buffers DOB0-DOBn are selectively brought to the low level in a case where the output control signal $\phi$oe is rendered the high level and where the corresponding inverted internal output signals Do0-$\overline{\text{Don}}$ are rendered the logic "0," namely, the high level.

In each of the data output buffers DOB0-DOBn, two output MOSFET's Q1 (first output MOSFET) and Q2 (second output MOSFET) of the N-channel type are connected in series form between the power source voltage Vcc (first power source voltage) and ground potential line GND of the circuitry though no special restriction is intended. The source and drain of the respective output MOSFET's Q1 and Q2 connected in common are coupled to the corresponding one of the data output terminals D0-Dn.

The gates of the output MOSFET's Q1 of the respective data output buffers are supplied with the output signals of the corresponding NOR gates NOG1. Therefore, the output MOSFET's Q1 are selectively turned "on" when the output signals of the NOR gate circuits NOG1 become the high level, that is, when the output control signal $\phi$oe is rendered the high level and the corresponding inverted output signals Do0-$\overline{\text{Don}}$ are rendered the low level of the logic "1." Thus, the output signals at the high level of, e.g., the power source voltage Vcc are delivered to the data output terminals D0-Dn and through the corresponding output MOSFET's Q1. On the other hand, the gates of the output MOSFET's Q2 of the respective data output buffers are supplied with the inverted signals of the output signals of the NAND gates NAG1 as produced by inverter circuits N2. Though not especially restricted, N-channel MOSFET's Q3 (third MOSFET) and Q4 (fourth MOSFET) in series form are formed across the gate of the output MOSFET Q2 and the corresponding one of the data output terminals D0-Dn. The gate of the MOSFET Q3 is supplied with the inverted signal of the output signal of the NAND gate circuit NAG1 as produced by an inverter circuit N3. In addition, the gate of the MOSFET Q4 is supplied with the delayed signal of the output signal of the NAND gate circuit NAG1 as produced by inverter circuits N4 and N5. Here, though no special restriction is meant, a MOSFET constituting the inverter circuit N2 is designed so as to have a somewhat lower conductance when compared with a MOSFET constituting the inverter circuit N3. Besides, MOSFET's constituting the inverter circuits N4 and N5 are designed so as to have conductances with which the total delay time of these MOSFET's becomes, for example, several nanoseconds.

Meanwhile, the output buffer OBc has the same circuit arrangement as that of each of the data output buffer DOB0-DOBn. Though no special restriction is intended, one input terminal of the NOR gate circuit NOG1 of the output buffer OBc is coupled to the ground potential of the circuitry, and one input terminal of the NAND gate circuit NAG1 is coupled to the power source voltage Vcc of the circuitry. The other input terminals of the NOR gate circuit NOG1 and NAND gate circuit NAG1 are supplied with the inverted internal output signal $\overline{\text{Co}}$ in common from the condition decision circuit CND stated before. Owing to these facts, the NOR gate circuit NOG1 and NAND gate circuit NAG1 of the output buffer OBc are normally held in transferring states, and the output signal of the output buffer OBc, namely, the sequence control signal CTa is selectively rendered the high level or low level in accordance with the inverted internal output signal $\overline{\text{Co}}$. More specifically, when the output signal of the condition decision circuit CND is validated to render the inverted internal output signal $\overline{\text{Co}}$ the low level, the output signal of the NOR gate circuit NOG1 of the output buffer OBc is brought to the high level, and the output MOSFET Q1 is turned "on." Accordingly, the sequence control signal CTa is brought to the high level of, e. g., the power source voltage Vcc of the circuitry. When the inverted internal output signal $\overline{\text{Co}}$ is rendered the high level, the output signal of the NAND gate circuit NAG1 is brought to the low level, and the output MOSFET Q2 is turned "on." Accordingly, the sequence control signal CTa is brought to the low level of, e. g., the ground potential of the circuitry.

Figure 3:
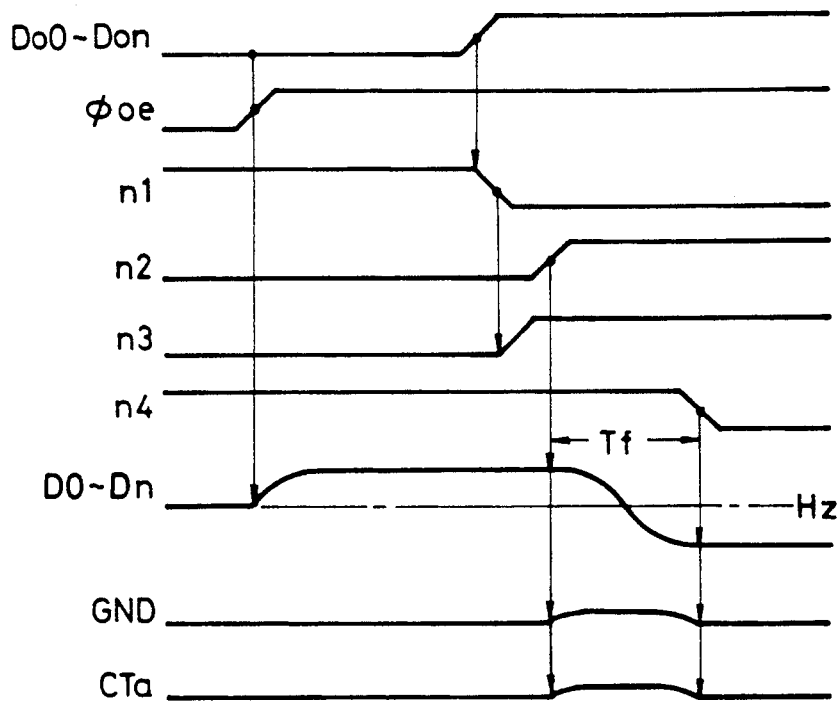
FIG. 3 is a signal waveform diagram for explaining the embodiment of the output circuits in FIG. 2.

FIG. 3 shows a signal waveform diagram of the embodiment of the data output buffers DOB0-DOBn in FIG. 2. The operation of the output circuits of this embodiment will be outlined in conjunction with FIGS. 2 and 3. In the case of the signal waveform diagram of FIG. 3, the inverted internal output signals Do0-$\overline{\text{Don}}$ are set at the logic "0" or the low level at first, and they are inverted to the logic "1" or the high level after the output control signal 0oe is rendered the high level. Meanwhile, the sequence control signal CTa which is delivered from the output buffer OBc is held at the low level.

Referring to FIG. 3, when the output control signal $\phi$oe is rendered the low level, the output signal of the inverter circuit N1, namely, the inverted output control signal $\overline{\phi\text{oe}}$ becomes the high level. Accordingly, the output signal n1 of the NAND gate circuit NAG1 of each of the data output buffers DOB0-DOBn is brought to the high level, and the output signal of the NOR gate circuit NOG1 is brought to the low level. In consequence, both the output MOSFET's Q1 and Q2 fall into the "off" states, and all the output signals of the data output buffers, namely, the output data items D0-Dn are set at high-impedance states Hz. On this occasion, since the output signal n1 of the NAND gate circuit NAG1 is rendered the high level, both the output signals n2 and n3 of the respective inverter circuits N2 and N3 become the low level, and the output signal n4 of the inverter circuit N5 becomes the high level. Accordingly, the MOSFET Q3 constituting the feedback circuit is turned "off," and the MOSFET Q4 is turned "on."

When the arithmetic/logic unit ALU is set at a predetermined operation mode and the output control signal $\phi$oe is rendered the high level at a predetermined timing, the output signal of the NOR gate circuit NOG1 of each data output buffer becomes the high level because the corresponding one of the inverted internal output signals Do0-$\overline{\text{Don}}$ is the low level. In addition, the output signal n1 of the NAND gate circuit NAG1 of each data output buffer remains at the high level because the corresponding one of the inverted internal output signals Do0-$\overline{\text{Don}}$ is the low level. Accordingly, the output MOSFET Q1 is brought into the "on" state, and the output MOSFET Q2 is held in the "off" state. Therefore, the output signals of the data output buffers, namely, the output data items D0-Dn are simultaneously rendered the high level of, e.g., the power source voltage Vcc of the circuitry.

Subsequently, in the state in which the output control signal $\phi$oe is held at the high level, the inverted internal output signals Do0-$\overline{\text{Don}}$ are changed from the logic "1" or the low level to the logic "0" or the high level. In each data output buffer, the output signal of the NOR gate circuit NOG1 is rendered the low level, and the output signal n1 of the NAND gate circuit NAG1 is changed to the low level. Consequently, the output signal n3 of the inverter circuit N3 constructed of the MOSFET having the comparatively high conductance is first brought to the high level, and the output signal n2 of the inverter circuit N2 is brought to the high level somewhat later. Besides, with a further delay of a time Tf, the output signal n4 of the inverter circuit N5 is changed from the high level to the low level.

In each data output buffer, the output MOSFET Q1 falls into the "off" state because the output signal of the NOR gate circuit NOG1 is rendered the low level, and the output MOSFET Q2 falls into the "on" state because the output signal n2 of the inverter circuit N2 is rendered the high level. Accordingly, the capacitive loads of all the output terminal are discharged, so that the output signals of the data output buffers, namely, the output data items D0-Dn are about to be simultaneously inverted to the low level of, e.g., the ground potential of the circuitry.

In each of the data output buffers DOB0-DOBn, however, the MOSFET Q3 constituting the feedback circuit falls into the "on" state because the output signal n3 of the inverter circuit N3 is rendered the high level. In addition, the MOSFET Q4 falls into the "off" state because the output signal n4 of the inverter circuit N5 is rendered the low level with the delay of the time Tf. Accordingly, the gate of the output MOSFET Q2 is coupled to the corresponding one of the data output terminals D0-Dn through the corresponding feedback circuit since the turn-on of the MOSFET Q3 till the turnoff of the MOSFET Q4, in other words, during the time Tf. In consequence, the output signal of the corresponding one of the data output terminals D0-Dn is negatively fed back to the gate of the MOSFET Q2, the gain of which is temporarily lowered. Thus, each of the output data items D0-Dn is changed toward the low level of, e.g., the ground potential of the circuitry comparatively slowly in accordance with the characteristic of the inverter circuit N2 of comparatively low driving ability.

As stated before, the time Tf is determined according to the ratio between the conductance of the MOSFET constituting the inverter circuit N3 and the conductances of the MOSFET's constituting the inverter circuits N4 and N5. The respective MOSFET's are therefore designed so as to have the predetermined conductances with which an operating speed required for the output circuit is satisfied, and besides, the level change of the corresponding one of the output data D0-Dn is properly suppressed.

Since the output signals of the data output buffers DOB0-DOBn, namely, the output data items D0-Dn are changed comparatively slowly, the current change of the ground potential feed line GND is suppressed. Therefore, the level of noise to develop on the ground potential feed line GND is remarkably reduced, with the result that noise components which are induced in the sequence control signals CTa etc. are rendered sufficiently less than the maximum specification $V_{OL}$ for the low level outputs.

As described above, in each of the data output buffers DOB0-DOBn of this embodiment, the feedback circuit composed of the MOSFET's Q3 and Q4 in series form is provided across the corresponding one of the data output terminals D0-Dn and the gate of the output MOSFET which is interposed between the output terminal and the ground potential of the circuitry. These MOSFET's Q3 and Q4 are simultaneously turned "on" for the predetermined time Tf when the corresponding output MOSFET Q2 is brought into the "on" state. Meantime, the output signal of the corresponding data output terminal is negatively fed back to the gate of the MOSFET Q2, and the gain of this MOSFET is temporarily suppressed to be low. Therefore, the high level of the data output terminals D0-Dn is slowly extracted, with the result that the noise of the ground potential line GND is suppressed. Accordingly, the sequence control signal CTa to be delivered from the output buffer OBc has the induced noise suppressed in spite of the fact that the ground potential of the circuitry is supplied to this output buffer OBc through the common ground-potential feed line GND. Thus, the operation of the digital processor including these output buffers is stabilized to heighten in reliability.

Example 2

Figure 4:
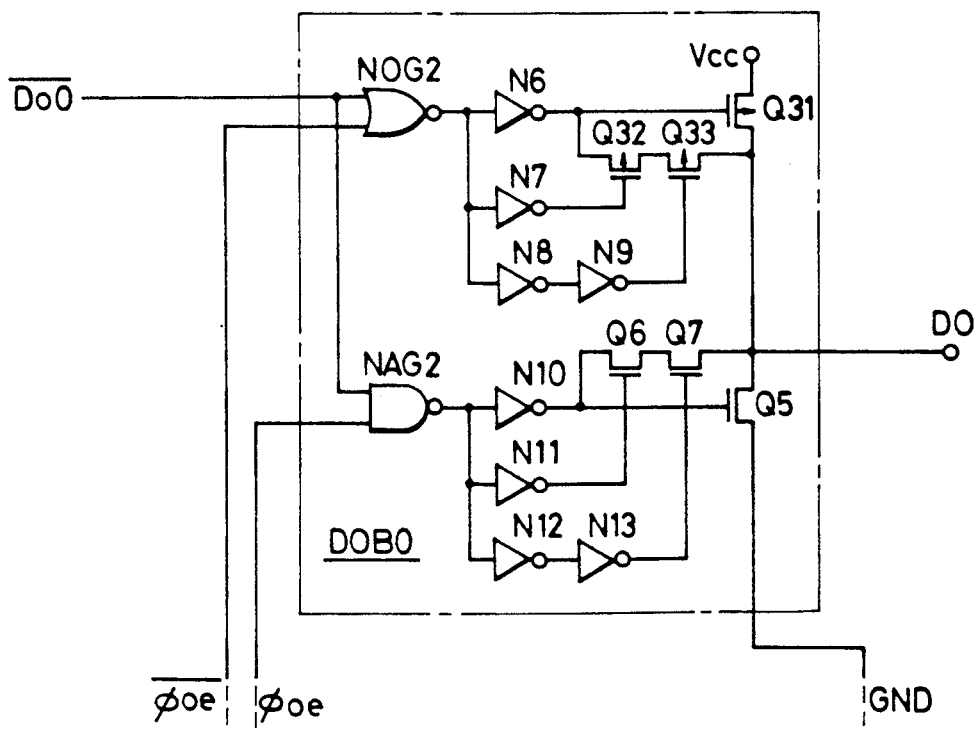
FIG. 4 is a circuit diagram showing the second embodiment of the output circuit to which this invention is applied.

FIG. 4 shows a circuit diagram of the second embodiment of the output circuit to which this invention is applied.

In each of the ensuing embodiments, among the output circuits included in the arithmetic/logic unit ALU of the digital processor, the data output buffer DOB0 will be exemplarily illustrated in a circuit diagram. Each of the other data output buffers DOB1-DOBn not shown shall have the same arrangement as that of the exemplified data output buffer DOB0.

The output circuit of this embodiment basically follows the first embodiment shown in FIG. 2. A NOR gate circuit NOG2, a NAND gate circuit NAG2, inverter circuits N10-N13 and MOSFET's Q5-Q7 in FIG. 4 correspond to the NOR gate circuit NOG1, the NAND gate circuit NAG1, the inverter circuits N2-N5 and the MOSFET's Q2-Q4 in FIG. 2 as they are, respectively. Now, only portions different from the constituents in FIG. 2 will be further described.

Figure 11:
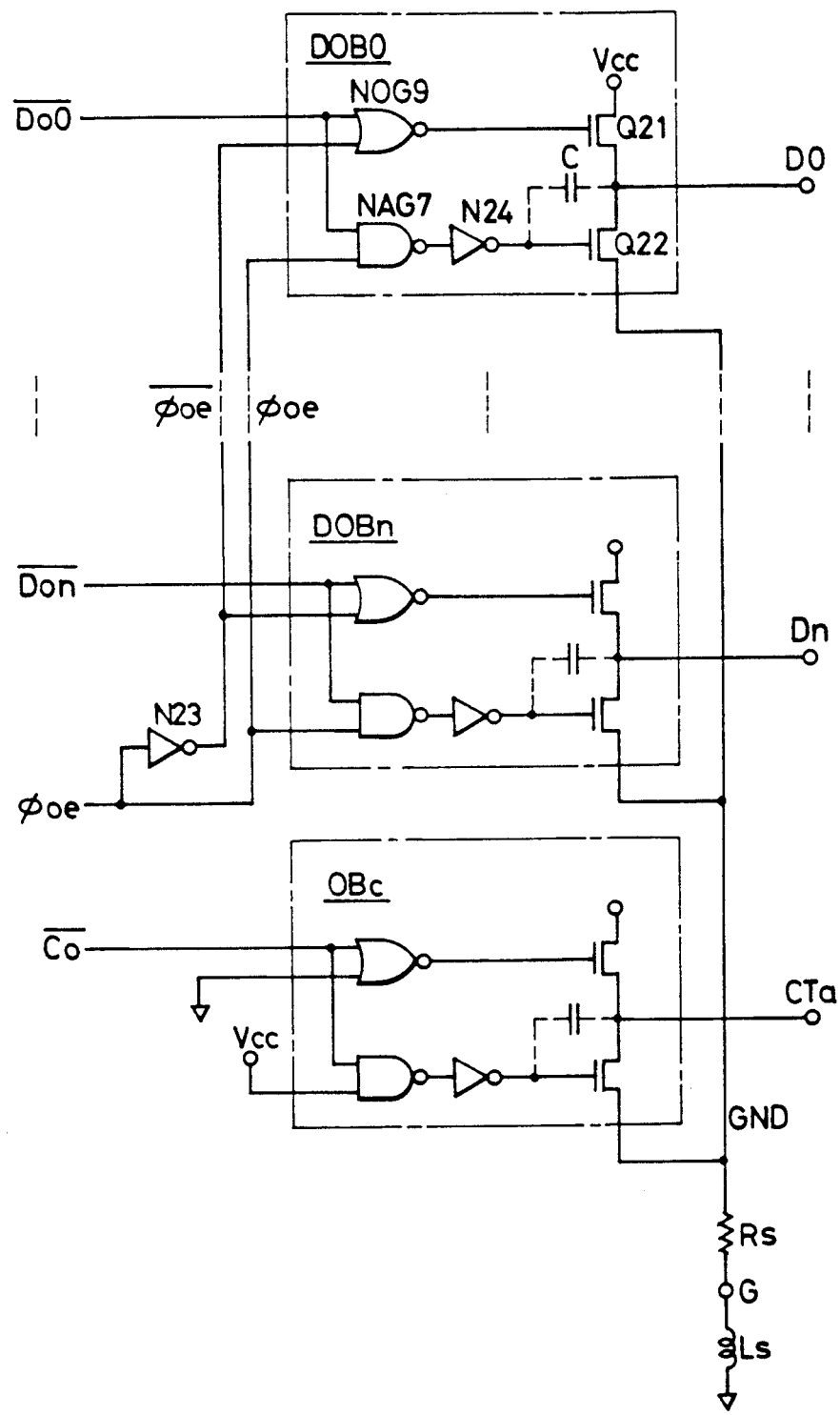
FIG. 11 is a circuit diagram showing a prior-art output circuits which was modified by the inventors by adding Miller capacitors in the course of developing the present invention.

Referring to FIG. 4, a P-channel MOSFET Q31 is substituted for the first output MOSFET which is interposed between each of the data output terminals D0-Dn and the power source voltage of the circuitry. Accordingly, at the point of time at which the output MOSFET's Q31 are turned "on" to bring the output data items D0-Dn to the high level, the gate-source voltages of the output MOSFET's Q31 are rendered substantially constant, and hence, the same problem as in the prior-art output circuit shown in FIG. 11 arises. In the output circuit of this embodiment, therefore, a feedback circuit composed of P-channel MOSFET's Q32 (fifth MOSFET) and Q33 (sixth MOSFET) in series form is provided across each of the data output terminals D0-Dn and the gate of the corresponding output MOSFET Q31.

The output signal of the NOR gate circuit NOG2 is inverted by an inverter circuit N6, and the inverted signal is supplied to the gate of the output MOSFET Q31. In addition, the output signal of the NOR gate circuit NOG2 is inverted by an inverter circuit N7 and then supplied to the gate of the MOSFET Q32 constituting the feedback circuit, and it is also supplied to the gate of the MOSFET Q33 through inverter circuits N8 and N9. In correspondence with the first embodiment, a MOSFET constituting the inverter circuit N6 is designed so as to have a comparatively low conductance, and MOSFET's constituting the inverter circuits N8 and N9 are designed so that the delay time thereof may become the time Tf stated before.

With the output circuit of this embodiment, when the corresponding one of the inverted internal output signals Do0-$\overline{\text{Don}}$ is changed from the high level to the low level in the state in which the output control signal $\phi$oe is the high level, the falling change of the corresponding one of the output data items D0-Dn is moderated by the same effect as that of the first embodiment. On the other hand, when the corresponding one of the inverted internal output signals Do0-$\overline{\text{Don}}$ is changed from the low level to the high level in the state in which the output control signal $\phi$oe is the high level, both the MOSFET's Q32 and Q33 constituting the feedback circuit are turned "on" for the time Tf corresponding to the delay time of the inverter circuits N8 and N9. Meantime, the level of the corresponding one of the data output terminals D0-Dn, namely, the corresponding one of the output data items D0-Dn is negatively fed back to the gate of the output MOSFET Q11. In consequence, the gain of an amplifier circuit basically constructed of the output MOSFET Q31 is temporarily lowered, and the rising change of the corresponding one of the output data items D0–Dn is moderated.

Owing to these facts, in the output circuit of this embodiment, the output data items D0–Dn are simultaneously rendered the high level or the low level, so that the levels of noise to develop on the power source voltage feed line and the ground potential feed line are both suppressed. Thus, the levels of noise to be induced on the sequence control signals CTa etc. which are delivered from the output buffers OBc etc. that receive operating source voltages through the power source voltage feed line and the ground potential feed line are suppressed, and the operation of the digital processor including the output circuits is stabilized.

Example 3

Figure 5:
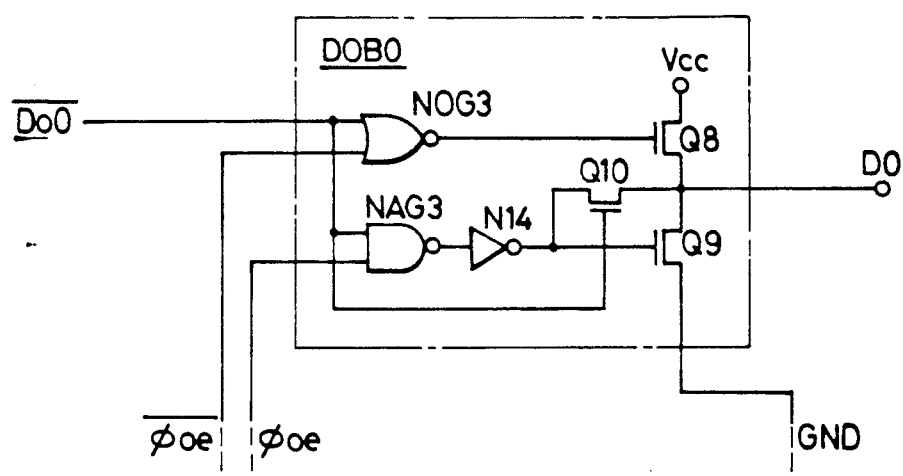
FIG. 5 is a circuit diagram showing the third embodiment of the output circuit to which this invention is applied.

FIG. 5 shows a circuit diagram of the third embodiment of the output circuit to which this invention is applied.

In the figure, a NOR gate circuit NOG3, a NAND gate circuit NAG3, an inverter circuit N14 and output MOSFET's Q8 and Q9 correspond respectively to the NOR gate circuit NOG1, the NAND gate circuit NAG1, the inverter circuit N2 and the output MOSFET's Q1 and Q2 in FIG. 2 as they are. Now, only portions different from the constituents in FIG. 2 will be further described.

Referring to FIG. 5, an N-channel MOSFET Q10 (seventh MOSFET) is provided across the gate of the output MOSFET Q9 (second output MOSFET) of each output buffer and the corresponding one of the data output terminals D0–Dn. This MOSFET Q10 constructs a feedback circuit for the output MOSFET Q9. The gate of the MOSFET Q10 is supplied with the corresponding one of the inverted internal output signals Do0–$\overline{\text{Do}}$n.

In accordance with the fact that the corresponding one of the inverted internal output signals Do0–$\overline{\text{Do}}$n is brought to the high level of the logic "0," the MOSFET Q10 constructing the feedback circuit is turned "on" irrespective of the output control signal φoe. Thus, when the corresponding output MOSFET Q9 is turned "on," the gate thereof is subjected to the negative feedback of the level of the corresponding one of the data output terminals D0–Dn, namely, the corresponding one of the output data items D0–Dn. In consequence, the gain of the amplifier circuit basically constructed of the output MOSFET Q9 is temporarily lowered. Thus, the level changes of the output data items D0–Dn are made comparatively gentle, and the level of the noise of the ground potential feed line GND is suppressed. As a result, the operation of the digital processor including the output circuits is stabilized, and the reliability thereof is heightened.

In case of this embodiment, in response to the output signal of the inverter circuit N14 rendered the high level, the output MOSFET Q9 is turned "on," and the MOSFET Q10 constructing the feedback circuit is simultaneously turned "on." Therefore, a through current flows through these MOSFET's Q9 and Q10. This embodiment accordingly serves as an effective measure in such a case where the quantity of the feedback may be small, namely, where the conductance of the MOSFET Q10 may be comparatively low. Needless to say, since the output circuit of this embodiment has its circuit arrangement simplified as compared with the first and second embodiments, reduction in the cost of the digital processor can also be promoted.

Example 4

Figure 6:
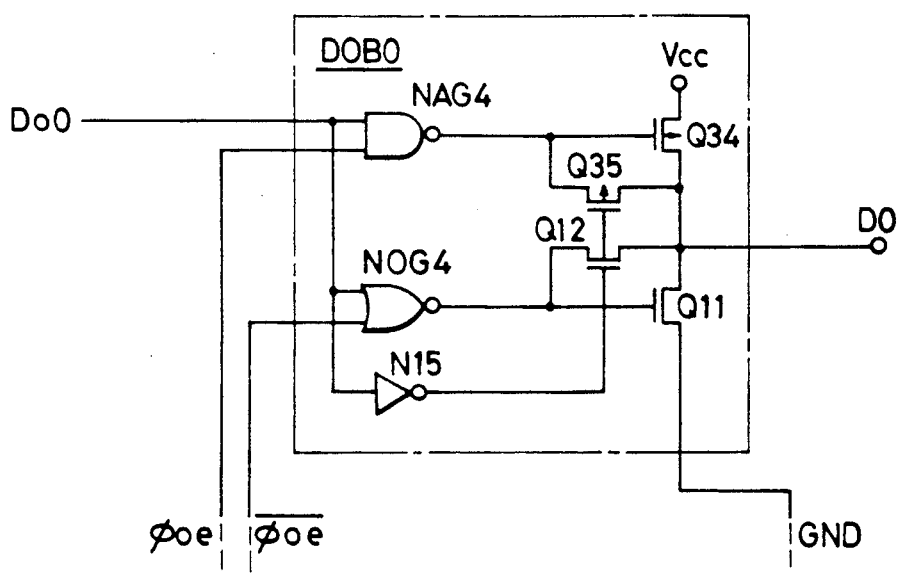
FIG. 6 is a circuit diagram showing the fourth embodiment of the output circuit to which this invention is applied.

FIG. 6 shows a circuit diagram of the fourth embodiment of the output circuit to which this invention is applied.

The output circuit of this embodiment basically follows the third embodiment shown in FIG. 5. An output MOSFET Q11 and a MOSFET Q12 constructing a feedback circuit in FIG. 6 correspond to the MOSFET's Q9 and Q10 in FIG. 5 as they are, respectively. Now, only portions different from the constituents of the third embodiment shown in FIG. 5 will be further described.

Referring to FIG. 6, an output MOSFET Q34 (first output MOSFET) of the P-channel type is interposed between each of the data output terminals D0–Dn of the output buffers and the power source voltage of the circuitry. At the point of time at which this output MOSFET Q34 is turned "on" to change the corresponding one of the output data items D0–Dn to the high level, the gate-source voltage of the output MOSFET Q34 is rendered substantially constant, and the same problem as in the prior-art output circuit shown in FIG. 11 arises. In the output circuit of this embodiment, therefore, a feedback circuit constructed of a P-channel MOSFET Q35 (eighth MOSFET) is formed across each of the data output terminals D0–Dn and the gate of the corresponding output MOSFET Q34.

The gate of the MOSFET Q35 constructing the feedback circuit is coupled in common to the gate of the N-channel MOSFET Q12 constructing the other feedback circuit, and is further coupled to the output terminal of an inverter circuit N15. The input terminal of the inverter circuit N15 is supplied with the corresponding one of the internal output signals Do0–Don. The internal output signals Do0–Don are brought to the low level at the logic "0," and to the high level at the logic "1." Accordingly, the MOSFET Q35 is selectively turned "on" when the output signal of the inverter circuit N15 is rendered the low level, namely, when the corresponding one of the internal output signals Do0–-Don is rendered the high level of the logic "1." In addition, the MOSFET Q12 is selectively turned "on" when the output signal of the inverter circuit N15 is rendered the high level, namely, when the corresponding one of the internal output signals Do0–Don is rendered the low level of the logic "0."

The gate of the output MOSFET Q34 is supplied with the output signal of a NAND gate circuit NAG4. One input terminal of the NAND gate circuit NAG4 is supplied with the output control signal φoe, while the other input terminal thereof is supplied with the corresponding one of the internal output signals Do0–Don. Thus, the output MOSFET Q34 is selectively turned "on" when the output signal of the NAND gate circuit NAG4 is rendered the low level, namely, when the output control signal φoe is rendered the high level with the corresponding one of the internal output signals Do0–Don set at the high level of the logic "1." In accordance with the "on" state of the output MOSFET Q34, the corresponding one of the output data D0–Dn is brought to the high level of, e.g., the power source voltage Vcc of the circuitry. Since, on this occasion, the output signal of the inverter circuit N15 is rendered the low level, the MOSFET Q35 constructing the feedback circuit is brought into the "on" state as described above. In consequence, the level of the corresponding one of the output data items D0–Dn is negatively fed back to the gate of the output MOSFET Q34, and the gain of an amplifier circuit basically constructed of the output MOSFET Q34 is temporarily lowered. Thus, the rising changes of the output data D0–Dn are moderated, and the operation of the digital processor including the output circuits is stabilized.

Meanwhile, the gate of the output MOSFET Q11 is supplied with the output signal of a NOR gate circuit NOG4. One input terminal of the NOR gate circuit NOG4 is supplied with the inverted output control signal $\bar{\phi}oe$, while the other input terminal thereof is supplied with the corresponding one of the internal output signals Do0–Don. Thus, the output MOSFET Q11 is selectively turned "on" when the output signal of the NOR gate circuit NOG4 is rendered the high level, namely, when the output control signal $\phi oe$ is rendered the high level with the corresponding one of the internal output signals Do0–Don set at the low level of the logic "0." In accordance with the "on" state of the output MOSFET Q11, the corresponding one of the output data items D0–Dn is brought to the low level of, e.g., the ground potential of the circuitry. Since, on this occasion, the output signal of the inverter circuit N15 is rendered the high level, the MOSFET Q12 constructing the feedback circuit is brought into the "on" state as described above. In consequence, the level of the corresponding one of the output data items D0–Dn is negatively fed back to the gate of the output MOSFET Q11, and the gain of the amplifier circuit basically constructed of the output MOSFET Q11 is temporarily lowered. Thus, the falling changes of the output data D0–Dn are moderated, and the operation of the digital processor including the output circuits is stabilized.

This embodiment is effective in a case where the output MOSFET of each output buffer for delivering the high level is made the P-channel type. Likewise to the third embodiment, it produces the effect that the arrangement of the output circuit is simplified, so the reduction of the cost of the digital processor can also be promoted.

Example 5

Figure 7:
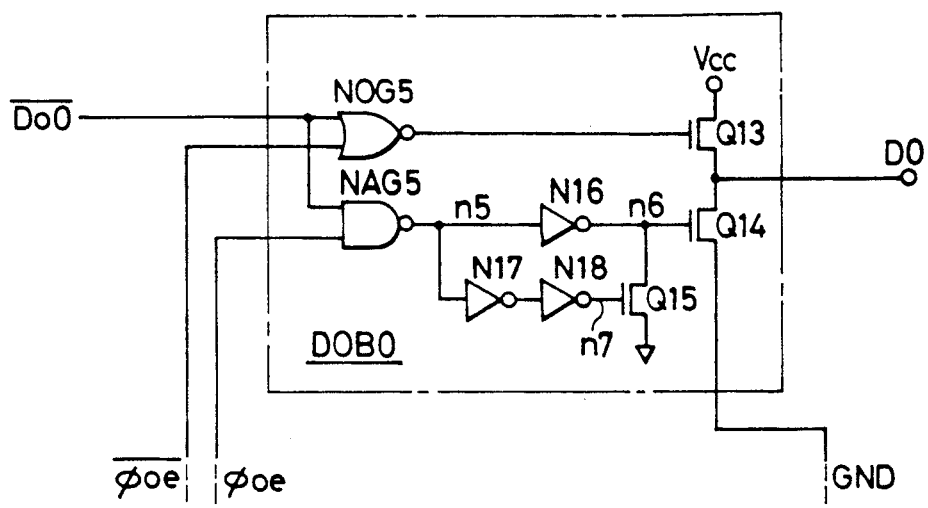
FIG. 7 is a circuit diagram showing the fifth embodiment of the output circuit to which this invention is applied.

Shown in FIG. 7 is a circuit diagram of the fifth embodiment of the output circuit to which this invention is applied.

In lieu of the feedback circuit that is formed across the data output terminal and the gate of the output MOSFET in each of the foregoing embodiments, this embodiment includes a short-circuiter that is formed across the gate and source of an output MOSFET and that is temporarily brought into a transferring state at the initial stage of a process in which the corresponding output MOSFET is turned "on." As will be explained later, this short-circuiter functions to temporarily lower the gain of an output amplifier circuit basically constructed of the output MOSFET at the initial stage of the process in which the output MOSFET is brought into the "on" state.

A NOR gate circuit NOG5, a NAND gate circuit NAG5, an inverter circuit N16, and output MOSFET's Q13 and Q14 shown in FIG. 7 correspond to the NOR gate circuit NOG1, the NAND gate circuit NAG1, the inverter circuit N2, and the output MOSFET's Q1 and Q2 shown in FIG. 2 as they are, respectively. Now, only portions different from the constituents in FIG. 2 will be further described.

Referring to FIG. 7, each of the data output buffers DOB0–DOBn is basically constructed of the output MOSFET's Q13 (first output MOSFET) and Q14 (second output MOSFET) of the N-channel type which are connected in series form between the power source voltage Vcc and ground potential feed line GND of the circuitry. The gate of the output MOSFET Q13 is coupled to the output terminal of the NOR gate circuit NOG5, while the gate of the output MOSFET Q14 is coupled to the output terminal of the inverter circuit N16. The input terminal of the inverter circuit N16 is coupled to the output terminal of the NAND gate circuit NAG5. Thus, the output MOSFET Q13 is selectively turned "on" when the output signal of the NOR gate circuit NOG5 is rendered the high level, namely, when the inverted output control signal $\bar{\phi}oe$ is rendered the low level with the corresponding one of the inverted internal output signals $\overline{Do0}$–$\overline{Don}$ set at the low level of the logic "1." Thus, the corresponding one of the output data items D0–Dn is rendered the high level of, e.g., the power source voltage Vcc of the circuitry. On the other hand, the output MOSFET Q14 is selectively turned "on" when the output signal of the inverter circuit N16 is rendered the high level, namely, when the output control signal $\phi oe$ is rendered the high level with the corresponding one of the inverted internal output signals $\overline{Do0}$–$\overline{Don}$ set at the high level of the logic "0." Thus, the corresponding one of the output data items D0–Dn is rendered the low level of, e.g., the ground potential of the circuitry.

In this embodiment, the output MOSFET Q13 constructs a source-follower type amplifier circuit similarly to that of any of the foregoing embodiments. Therefore, the driving ability of the NOR gate circuit NOG5 is made comparatively low in this embodiment. Thus, the rise of each of the output data items D0–Dn is moderated in cooperation with the fact that the gate-source voltage of the output MOSFET Q13 is decreased with the rise of the corresponding one of the output data items D0–Dn. In consequence, noise to develop on the power source voltage feed line due to the simultaneous turn-on operations of the output MOSFET's Q13 is suppressed without requiring any special countermeasure.

In the data output buffer of this embodiment, a short-circuiter constructed of a MOSFET Q15 (ninth MOSFET) is further provided across the gate of the output MOSFET Q14 and the source thereof, namely, the ground potential of the circuitry. The gate of this MOSFET Q15 is supplied with the delayed signal of the output signal of the NAND gate circuit NAG5 as produced by inverter circuits N17 and N18. When the output signal of the NAND gate circuit NAG5 is rendered the high level, the output signal of the inverter circuit N16 is rendered the low level, and the output MOSFET Q14 is turned "off." On this occasion, the output signal of the inverter circuit N18 is rendered the high level, and the MOSFET Q15 is turned "on." When the output signal of the NAND gate circuit NAG5 is rendered the low level, the output signal of the inverter circuit N16 becomes the high level, and the output MOSFET Q14 falls into the "on" state as described before. On this occasion, the output signal of the inverter circuit N18 is held at the high level along with the output signal of the inverter circuit N16 for a period corresponding to a delay time based on the inverter circuits N17 and N18. Accordingly, at the initial stage of the process in which the output MOSFET Q14 is turned "on," the MOSFET Q15 is simultaneously turned "on" for the total delay time of the inverter circuits N17 and N18, so that the short-circuiter is held in the transferring state. Meantime, the gate voltage of the output MOSFET Q14 is suppressed to a predetermined voltage which depends upon the ratio of the conductances of a P-channel MOSFET constituting the inverter circuit N16 and the above MOSFET Q15. Accordingly, the conductance of the output MOSFET Q14 is lowered, and the gain of the output amplifier circuit basically constructed of the output MOSFET Q14 is temporarily lowered.

Figure 8:
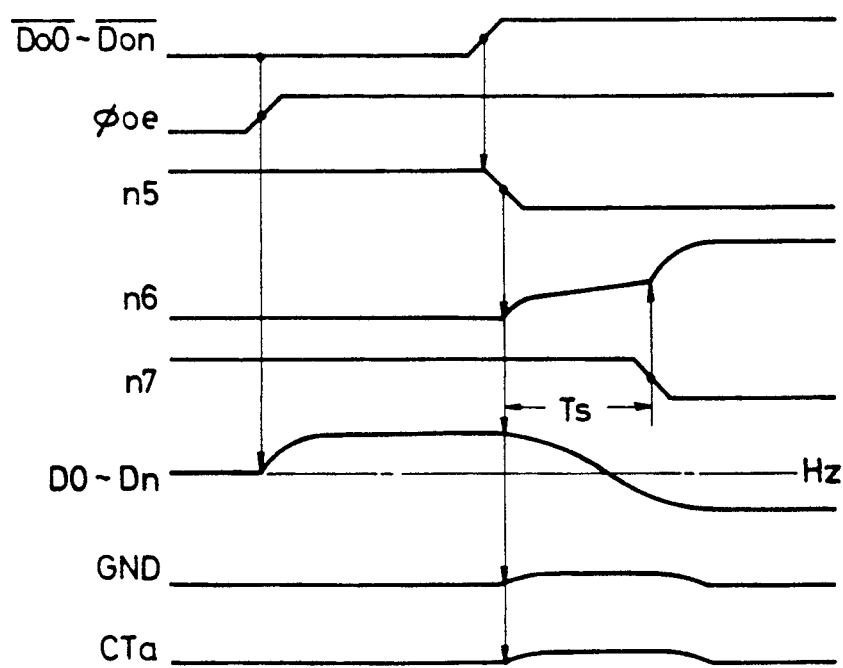
FIG. 8 is a signal waveform diagram for explaining the embodiment of the output circuit in FIG. 7.

FIG. 8 shows a signal waveform diagram of the embodiment of the data output buffers DOB0-DOBn in FIG. 7. The operation of the output circuits of this embodiment will be outlined in conjunction with FIGS. 7 and 8. In the case of the signal waveform diagram of FIG. 8, the inverted internal output signals Do0-$\overline{\text{Don}}$ are set at the logic "1" or the low level at first, and they are inverted to the logic "0" or the high level after the output control signal $\phi$oe is rendered the high level. Meantime, the sequence control signal CTa which is delivered from the output buffer OBc is held at the low level.

Referring to FIG. 8, when the output control signal $\phi$oe is rendered the low level to bring the corresponding inverted output control signal $\phi$oe to the high level, the output signal of the NOR gate circuit NOG5 of each of the data output buffers DOB0-DOBn is set at the low level, and the output signal n5 of the NAND gate circuit NAG5 is set at the high level. In addition, since the output signal n5 of the NAND gate circuit NAG5 is set at the high level, the output signal n6 of the inverter circuit N16 is rendered the low level. In consequence, both the output MOSFET's Q13 and Q14 fall into the "off" states, and all the output signals of the data output buffers, namely, the output data items D0-Dn are set at high-impedance states Hz. On this occasion, since the output signal n5 of the NAND gate circuit NAG5 is rendered the high level, the output signal n7 of the inverter circuit N18 is rendered the high level, and the MOSFET Q15 constructing the short-circuiter falls into the "on" state. Besides, the gate voltage of the output MOSFET Q14 is rendered the low level because of the low level of the output signal of the inverter circuit N16 and the "on" state of the MOSFET Q15.

When the arithmetic/logic unit ALU is set at a predetermined operation mode and the output control signal $\phi$oe is rendered the high level at a predetermined timing, the output signal of the NOR gate circuit NOG5 of each data output buffer becomes the high level because the corresponding one of the inverted internal output signals Do0-$\overline{\text{Don}}$ is the low level. In addition, the output signal n5 of the NAND gate circuit NAG5 remains at the high level because the corresponding one of the inverted internal output signals Do0-$\overline{\text{Don}}$ is the low level. Accordingly, the output MOSFET Q13 is brought into the "on" state, and the output MOSFET Q14 is held in the "off" state. Therefore, the output signals of the data output buffers, namely, the output data items D0-Dn are simultaneously rendered the high level of, e.g., the power source voltage Vcc of the circuitry. On this occasion, the gate-source voltages of the output MOSFET's Q13 gradually decrease owing to the increases of the levels of the output data items D0-Dn, and the driving abilities of the NOR gate circuits NOG5 become comparatively low. Accordingly, the rises of the output data items D0-Dn are automatically moderated, and the level of noise to develop on the power source voltage feed line is suppressed.

Subsequently, in the state in which the output control signal $\phi$oe is held at the high level, the inverted internal output signals Do0-$\overline{\text{Don}}$ are changed from the low level of the logic "1" to the high level of the logic "0." In each data output buffer, the output signal of the NOR gate circuit NOG5 is rendered the low level, and the output signal n5 of the NAND gate circuit NAG5 is changed to the low level. Consequently, the output signal of the inverter circuit N16 is first brought to the high level, and the output signal n7 of the inverter circuit N18 is brought to the low level after the delay time Ts of the inverter circuits N17 and N18.

In each data output buffer, the output MOSFET Q13 falls into the "off" state because the output signal of the NOR gate circuit NOG5 is rendered the low level, and the output MOSFET Q14 is about to fall into the "on" state because the output signal of the inverter circuit N16 is rendered the high level.

In the data output buffer of this embodiment, however, the MOSFET Q15 constructing the short-circuiter continues the "on" state since the output signal of the inverter circuit N16 has been rendered the high level and until the output signal n7 of the inverter circuit N18 is rendered the low level, that is, for the delay time Ts based on the inverter circuits N17 and N18. Meantime, accordingly, the gate voltage n6 of the output MOSFET Q14 cannot rise up to the high level such as the power source voltage Vcc of the circuitry and is suppressed to a predetermined level dependent upon the ratio of the conductances of the P-channel MOSFET constituting the CMOS inverter circuit N16 and the MOSFET Q15 constructing the short-circuiter. Therefore, the gain of the amplifier circuit basically constructed of the output MOSFET Q14 is temporarily lowered, and the change of the fall of each of the output data items D0-Dn is made gentle. Thus, the current change of the ground potential feed line GND is suppressed, and the level of noise to develop on the ground potential feed line GND is remarkably reduced. As a result, noise components which are induced in the sequence control signals Cta etc. are rendered sufficiently less than the maximum specification $V_{OL}$ for the low level outputs, and the malfunction of the digital processor including the output circuits is prevented.

The delay time Ts is determined according to the conductances of the MOSFET's which constitute the inverter circuits N17 and N18. Besides, when the MOSFET Q15 is simultaneously turned "on," the gain of the amplifier circuit basically constructed of the MOSFET Q14 is determined according to the conductance ratio between the P-channel MOSFET constituting the inverter circuit N16 and the MOSFET Q15 as stated before. The respective MOSFET's are therefore designed so as to have the predetermined conductances with which an operating speed for the output circuit is satisfied, and besides, the level change of the corresponding one of the output data items D0-Dn is properly suppressed.

Example 6

Figure 9:
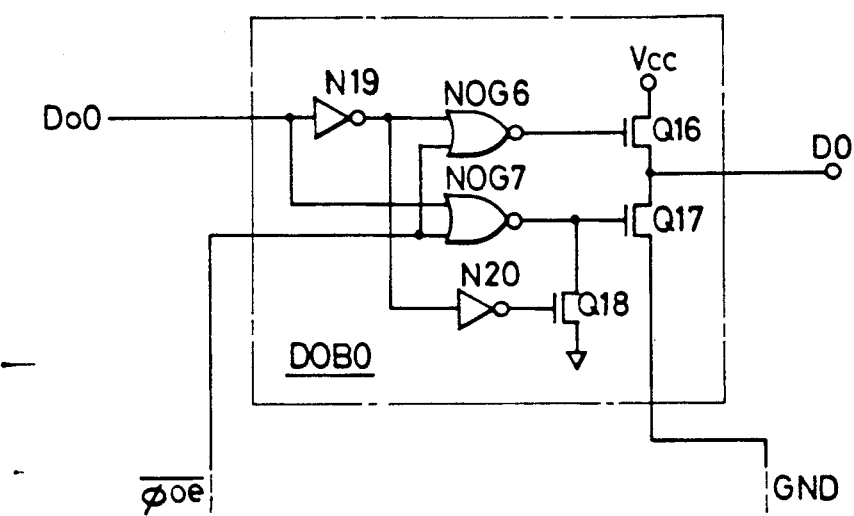
FIG. 9 is a circuit diagram showing the sixth embodiment of the output circuit to which this invention is applied.

FIG. 9 shows the sixth embodiment of the output circuit to which this invention is applied.

This embodiment follows the fifth embodiment, and output MOSFET's Q16 and Q17 and a MOSFET Q18 shown in FIG. 9 correspond respectively to the output MOSFET's Q13 and Q14 and the MOSFET Q15 shown in FIG. 7 as they are. Now, only portions different from the constituents in the embodiment of FIG. 7 will be further described.

Referring to FIG. 9, the gate of the output MOSFET Q16 (first output MOSFET) of each data output buffer is coupled to the output terminal of a corresponding NOR gate circuit NOG6, while the gate of the output MOSFET Q17 (second output MOSFET) is coupled to the output terminal of a corresponding NOR gate circuit NOG7. One input terminal of the NOR gate circuit NOG6 is supplied with the inverted signal of the corresponding one of the internal output signals Do0-Don as produced by an inverter N19. In addition, one input terminal of the NOR gate circuit NOG7 is supplied with the corresponding one of the internal output signals Do0-Don. The other input terminals of the NOR gate circuits NOG6 and NOG7 are supplied with the inverted output control signal $\phi$oe in common. Owing to these facts, when the output signal of the NOR gate circuit NOG6 is rendered the high level, namely, when the inverted output control signal $\phi$oe is rendered the low level of the logic "1" with the corresponding one of the internal output signals Do0-Don set at the high level of the logic "1," the output MOSFET Q16 is selectively turned "on" to bring the corresponding one of the output data items D0-Dn to the high level of, e.g., the power source voltage Vcc of the circuitry. On the other hand, when the output signal of the NOR gate circuit NOG7 is rendered the high level, namely, when the inverted output control signal $\phi$oe is rendered the low level of the logic "1" with the corresponding one of the internal output signals Do0-Don set at the low level of the logic "0," the output MOSFET Q17 is selectively turned "on" to bring the corresponding one of the output data items D0-Dn to the low level of, e.g., the ground potential of the circuitry.

Meanwhile, the gate of the MOSFET Q18 (ninth MOSFET) in each of the data output buffers DOB-0-DOBn of this embodiment is coupled to the output terminal of an inverter circuit N20. The input terminal of this inverter circuit N20 is coupled to the output terminal of the inverter circuit N19. The inverter circuit N20 exhibits a comparatively great transfer delay time in such a way that a MOSFET constituting it is designed so as to have a comparatively low conductance. This transfer delay time corresponds to the delay time Ts of the fifth embodiment. Owing to these facts, the MOSFET Q18 is selectively turned "on" when the output signal of the inverter circuit N20 is rendered the high level, namely, when the corresponding one of the internal output signals Do0-Don is rendered the high level. In addition, when the corresponding one of the internal output signals Do0-Don is changed from the high level to the low level, the MOSFET Q18 is turned "on" simultaneously with the MOSFET Q17 since the output signal of the NOR gate circuit NOG7 has been brought to the high level and until the output signal of the inverter circuit N20 is brought to the low level, that is, for the delay time Ts of the inverter circuit N20. Meantime, accordingly, the gain of the output amplifier circuit basically constructed of the output MOSFET Q17 is temporarily lowered. Thus, the output circuit of this embodiment has effects similar to those of the fifth embodiment, and the operation of the digital processor including the output circuits is stabilized.

Example 7

Figure 10:
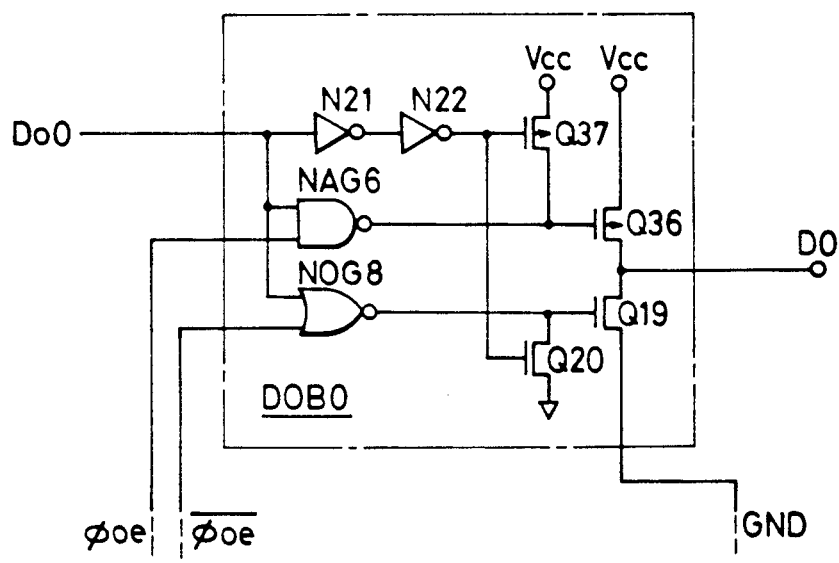
FIG. 10 is a circuit diagram showing the seventh embodiment of the output circuit to which this invention is applied.
Figure 12:
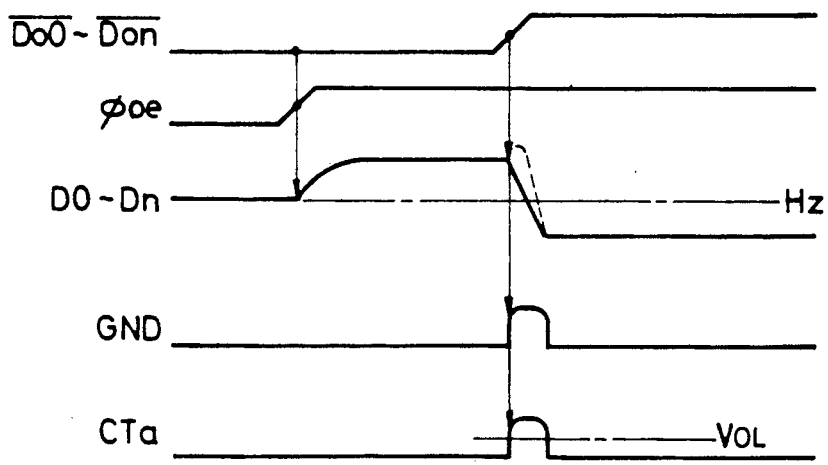
FIG. 12 is a signal waveform diagram of the output circuits in FIG. 11.

FIG. 10 shows a circuit diagram of the seventh embodiment of the output circuit to which this invention is applied.

In this embodiment, each of the data output buffers DOB0-DOBn is constructed as an output circuit of the so-called CMOS type. A NOR gate circuit NOG8, an output MOSFET Q19 and a MOSFET Q20 shown in FIG. 10 correspond to the NOR gate circuit NOG7, the output MOSFET Q17 and the MOSFET Q18 shown in FIG. 9 as they are, respectively. Now, only portions different from the constituents in FIG. 9 will be further described.

Referring to FIG. 10, the gate of an output MOSFET Q36 (first output MOSFET) of the P-channel type in each data output buffer is coupled to the output terminal of a corresponding NAND gate circuit NAG6. One input terminal of the NAND gate circuit NAG6 is supplied with the output control signal $\phi$oe, and the other input terminal thereof with the corresponding one of the internal output signals Do0-Don. Thus, when the output signal of the corresponding NAND gate circuit NAG6 is rendered the low level, namely, when the output control signal $\phi$oe is rendered the high level with the corresponding one of the internal output signals Do0-Don set at the high level of the logic "1," the output MOSFET Q36 is selectively turned "on" to bring the corresponding one of the output data items D0-Dn to the high level of, e.g., the power source voltage Vcc of the circuitry.

When the output MOSFET Q36 is turned "on" to bring the corresponding one of the output data items D0-Dn to the high level, the gate-source voltage of this output MOSFET Q36 is rendered constant irrespective of the levels of the output data items D0-Dn. In this embodiment, accordingly, the same problem as that of the prior-art output circuit shown in FIG. 11 arises at the time of the rising changes of the output data D0-Dn.

In the data output buffer of this embodiment, therefore, a short-circuiter constructed of a P-channel MOSFET Q37 (tenth MOSFET) is formed across the gate of the output MOSFET Q36 and the source thereof, namely, the power source voltage of the circuitry. Also, another short-circuiter constructed of the N-channel MOSFET Q20 (ninth MOSFET) is formed across the gate of the output MOSFET Q19 of the N-channel type and the source thereof, namely, the ground potential of the circuitry. The gates of the MOSFET's Q37 and Q20 are coupled in common to the output terminal of an inverter circuit N22. The input terminal of the inverter circuit N22 is coupled to the output terminal of an inverter circuit N21. The input terminal of the inverter circuit N21 is supplied with the corresponding one of the internal output signals Do0-Don. The inverter circuits N21 and N22 are designed so as to have a predetermined signal transfer time. This signal transfer time corresponds to the delay time Ts of the fifth embodiment.

Owing to these facts, when the output signal of the inverter circuit N22 is rendered the low level, namely, when the corresponding one of the internal output signals Do0-Don is rendered the low level of the logic "0," the MOSFET Q37 is selectively turned "on." Besides, when the corresponding one of the internal output signals Do0-Don is changed from the low level of the logic "0" to the high level of the logic "1," the MOSFET Q37 is turned "on" simultaneously with the output MOSFET Q36 since the output signal of the NAND gate circuit NAG6 has been rendered the low level and until the output signal of the inverter circuit N22 is rendered the high level, that is, for the delay time Ts. Meantime, accordingly, the gain of the output amplifier circuit basically constructed of the output MOSFET Q36 is temporarily lowered. Thus, with the output circuits of this embodiment, the same effect as in the fifth embodiment is achieved at the time of the rising changes of the output data D0–Dn, and the level of noise to develop on the power source voltage feed line is suppressed.

Likewise, when the output signal of the inverter circuit N22 is rendered the high level, namely, when the corresponding one of the internal output signals Do0–Don is rendered the high level of the logic "1," the MOSFET Q20 of each data output buffer is selectively turned "on." Besides, when the corresponding one of the internal output signals Do0–Don is changed from the high level of the logic "1" to the low level of the logic "0," the MOSFET Q20 is turned "on" simultaneously with the output MOSFET Q19 since the output signal of the NOR gate circuit NOG8 has been rendered the high level and until the output signal of the inverter circuit N22 is rendered the low level, that is, for the delay time Ts. Meantime, accordingly, the gain of the amplifier circuit basically constructed of the output MOSFET Q19 is temporarily lowered. Thus, with the data output buffers of this embodiment, the same effect as in the fifth embodiment can be attained also at the time of the falling changes of the output data D0–Dn, and the level of noise to develop on the ground potential feed line GND is suppressed.

In this manner, according to the output circuits of this embodiment, the levels of the noise components to develop on the power source voltage feed line and the ground potential feed line GND are suppressed at the times of the rising changes and falling changes of the output data D0–Dn. Therefore, the operation of the digital processor including the output circuits is stabilized, and the reliability thereof is enhanced.

As elucidated by the plurality of embodiments described above, the following effects are produced in cases where this invention is applied to output circuits included in a digital processor or the like constructed of a gate-array integrated circuit:

(1) Across the output terminal of an output circuit and the gate of an output MOSFET which is interposed between the output terminal and the power source voltage or ground potential of circuitry, a feedback circuit constructed of a single MOSFET which is selectively turned "on" when the output MOSFET is turned "on" is formed, thereby to attain the effect that the gain of an output amplifier circuit basically constructed of the output MOSFET can be selectively lowered.

(2) In the above item (1), the feedback circuit is replaced with a feedback circuit constructed of two MOSFET's which are simultaneously turned "on" for a predetermined time when the output MOSFET is turned "on," thereby to attain the effect that, while a through current is prevented, the gain of the output amplifier circuit basically constructed of the output MOSFET can be selectively lowered.

(3) Across the gate and source of an output MOSFET which is interposed between the output terminal of an output circuit and the power source voltage or ground potential of circuitry, a MOSFET that is temporarily turned "on" simultaneously with the output MOSFET at the initial stage of a process in which this output MOSFET is turned "on" is provided, thereby to attain the effect that the gate voltage of the output MOSFET is suppressed at a predetermined level, whereupon the gain of an output amplifier circuit basically constructed of the output MOSFET can be temporarily lowered.

(4) Owing to the above items (1)–(3), there is attained the effect that the rising or falling change of an output signal at the output terminal can be moderated.

(5) Owing to the above items (1)–(4), the change of a charge or discharge current into or from a load capacitance etc. coupled to the output terminal is suppressed, and the current change of a power source voltage feed line or a ground potential feed line is suppressed, thereby to attain the effect that the level of noise to develop on the power source voltage feed line or the ground potential feed line can be suppressed.

(6) Owing to the above items (1)–(5), there is attained the effect that the malfunction of another output circuit or an input circuit arranged in the vicinity of the aforementioned output circuit can be prevented.

(7) Owing to the above items (1)–(5), there is attained the effect that the levels of noise to be induced in control signals which are delivered from other output circuits that receive operating source voltages through the common power source voltage feed line and ground potential feed line can be suppressed.

(8) Owing to the above items (1)–(7), there is attained the effect that the malfunction of the digital processor or the like including the output circuits can be prevented, and that the reliability thereof can be enhanced.

(9) In the above items (1)–(8), various circuit elements to be added to the output circuits can be formed within a comparatively small area on a semiconductor substrate, and hence, there is attained the effect that the digital processor or the like can be realized without sacrificing the layout efficiency thereof.

Although, in the above, the invention made by the inventors has been concretely described in conjunction with embodiments, it is needless to say that this invention is not restricted to the foregoing embodiments, but that it can be variously altered within a scope not departing from the purport thereof. For example, in each of the embodiments of FIG. 2, FIG. 4 and FIG. 5, the MOSFET constituting the feedback circuit may well be of the P-channel type. Besides, in each of the embodiments of FIG. 2 and FIG. 4, the two MOSFET's constituting the feedback circuit may well be replaced with a single MOSFET which is temporarily turned "on" at the time of the falling change of the corresponding one of the output data items D0–Dn. In each of the embodiments, the delay circuit constructed of the inverter circuit or circuits may well be a delay circuit employing another means. In the embodiment of FIG. 7, FIG. 9 or FIG. 10, the MOSFET Q15, the MOSFET Q18 or the MOSFET Q20 or Q37 can be replaced with a MOSFET which is turned "on" simultaneously with the corresponding output MOSFET and which is turned "off" after lapse of the predetermined time Ts, or it may well be replaced with a plurality of MOSFET's which are held in transferring states under similar conditions. In each of the embodiments, it is also allowed to change the power source voltage Vcc to the ground potential of the circuitry and to simultaneously change the ground potential of the circuitry to a minus power source voltage, and the P-channel MOSFET's and the N-channel MOSFET's can be exchanged for each other by inverting the polarities of the power source voltages.

In the embodiment of FIG. 2, the output buffer OBc for delivering the sequence control signal CTa may well have a circuit arrangement differing from that of each of the data output buffers DOB0–DOBn. Further, the block arrangement of the digital processor shown in FIG. 1, the practicable circuit arrangements of the output circuits shown in FIG. 2, FIGS. 4–7 and FIGS. 9–10, and the signal levels etc. of the output control signal φoe and the internal output signals Do0–Don can take various aspects of performance.

In the foregoing, the invention made by the inventors has been principally described as to the application thereof to an output circuit included in a digital processor constructed of a gate-array integrated circuit, which forms the background field of utilization, but it is not restricted thereto but is also applicable to, for example, various sorts of semiconductor memories and digital controllers each of which includes similar output circuits,. The present invention can be extensively applied to digital devices each of which has, at least, a plurality of output circuits that are simultaneously brought into operating states in accordance with the predetermined output control signal φoe.

What is claimed is:

1. An output circuit for delivering an output having first and second levels at an output terminal thereof comprising:
   a first output MOSFET which has a source-drain path interposed between said output terminal and first power source voltage line and which delivers the output of a first level when turned on in response to a first signal applied to a gate thereof;
   a second output MOSFET which has a source-drain path interposed between said output terminal and a second power source voltage line and which delivers the output of a second level different from the first level when turned on in response to a second signal applied to a gate thereof; and
   a feedback circuit which is interposed between said output terminal and the gate of said second output MOSFET and which selectively couples said output terminal to the gate of said second output MOSFET so that a voltage at the output terminal is negatively fed back to the gate of said second output MOSFET when turned on,
   wherein said feedback circuit is comprised of:
   a third MOSFET which is normally off, and which is turned on before the second output MOSFET is turned on,
   a fourth MOSFET which is normally on, and which is turned off after a lapse of a predetermined time since said second output MOSFET has been turned on, and
   wherein said third MOSFET and said fourth MOSFET are connected in series form.

2. An output circuit according to claim 1, wherein said first and second power source voltage lines are supplied with a power source voltage and a ground potential of circuitry including said output circuit, respectively, and
   wherein said second output MOSFET and said third and fourth MOSFET's are N-channel MOSFET's.

3. An output circuit for delivering an output having first and second levels at an output terminal thereof comprising:
   a first output MOSFET which has a source-drain path interposed between said output terminal and a first power source voltage line and which delivers the output of a first level when turned on in response to a first signal applied to a gate thereof;
   a second output MOSFET which has a source-drain path interposed between said output terminal and a second power source voltage line and which delivers the output of a second level different from the first level when turned on in response to a second signal applied to a gate thereof;
   a first feedback circuit which is interposed between said output terminal and the gate of said first output MOSFET and which selectively couples said output terminal to the gate of said first output MOSFET so that a voltage at the output terminal is negatively fed back to the gate of said first output MOSFET when turned on; and
   a second feedback circuit which is interposed between said output terminal and the gate of said second output MOSFET and which selectively couples said output terminal to the gate of said second output MOSFET so that a voltage at the output terminal is negatively fed back to the gate of said second output MOSFET when turned on,
   wherein each of said first and second feedback circuits includes a MOSFET which has a source-drain path coupled between the output terminal and a corresponding gate of said MOSFET and which is temporarily held in a transferring state at an initial stage of a process in which a corresponding one of said first and second output MOSFETs is turned on.

4. An output circuit according to claim 3, wherein said first output MOSFET and said MOSFET in said first feedback circuit are of a p-channel conductivity type, and wherein said second output MOSFET and said MOSFET in said second feedback circuit are of an n-channel conductivity type.

5. An output circuit for delivering an output having first and second levels at an output terminal thereof comprising:
   a first output MOSFET which as a source-drain path interposed between said output terminal and a first power source voltage line and which delivers the output of a first level when turned on in response to a first signal applied to a gate thereof;
   a second output MOSFET which has a source-drain path interposed between said output terminal and a second power source voltage line and which delivers the output of a second level different from the first level when turned on in response to a second signal applied to a gate thereof;
   a first feedback circuit which is interposed between said output terminal and the gate of said first output MOSFET and which selectively couples said output terminal to the gate of said first output MOSFET so that a voltage at the output terminal is negatively fed back to the gate of said first output MOSFET when turned on; and
   a second feedback circuit which is interposed between said output terminal and the gate of said second output MOSFET and which selectively couples said output terminal to the gate of said second output MOSFET so that a voltage at the output terminal is negatively fed back to the gate of said second output MOSFET when turned on,
   wherein said first feedback circuit is comprised of:
   a third MOSFET which is normally off, and which is turned on before the first output MOSFET is turned on, a fourth MOSFET which is normally on, and which is turned off after a lapse of a predetermined time since said first output MOSFET has been turned on, and wherein said third MOSFET and said fourth MOSFET are connected in series form.

6. An output circuit according to claim 5, wherein said second feedback circuit is comprised of:
a fifth MOSFET which is normally off, and which is turned on before the second output MOSFET is turned on,
a sixth MOSFET which is normally on, and which is turned off after a lapse of a predetermined time since said second output MOSFET has been turned on, and
wherein said fifth MOSFET and said sixth MOSFET are connected in series form.

7. An output circuit according to claim 6, wherein said first and second power source voltage lines are supplied with a power source voltage and a ground potential of circuitry including said output circuit, respectively,
wherein said first output MOSFET is a P-channel MOSFET, and
wherein said second output MOSFET is an N-channel MOSFET.

8. An output circuit according to claim 7, wherein said third and fourth MOSFET's are P-channel MOSFET's, and
wherein said fifth and sixth MOSFET's are N-channel MOSFET's.

9. An output circuit for delivering an output having first and second levels at an output terminal thereof comprising:
a first output MOSFET which has a source-drain path interposed between said output terminal and a first power source voltage line and which delivers the output of a first level when turned on in response to a first signal applied to a gate thereof;
a second output MOSFET which has a source-drain path interposed between said output terminal and a second power source voltage line and which delivers the output of a second level different from the first level when turned on in response to a second signal applied to a gate thereof; and
a short-circuit means including a third MOSFET which as a source-drain path interposed between the gate of said second MOSFET and the second power source line; and
means for temporarily holding said third MOSFET in a transferring state at an initial stage of a process in which said second MOSFET is turned on so that a level change of a voltage on the gate of said second MOSFET is made at a predetermined slow rate during said initial stage.

10. An output circuit according to claim 9, wherein said first and second power source voltage lines are supplied with a power source voltage and a ground potential of circuitry, respectively,
wherein said second output MOSFET is an N-channel MOSFET, and
wherein said third MOSFET is of N-channel type and has a gate of which receives a third signal, a level of which is set to a low level from a high level while a level of the second signal is set to the high level from a low level.

11. An output circuit according to claim 10, wherein said third MOSFET is designed so as to have a conductance ratio with which a gate voltage of said second MOSFET is lowered to a predetermined level when said third MOSFET is turned "on" along with said second MOSFET, relative to a P-channel MOSFET which constitutes a driver circuit disposed at a stage preceding said gate of said second MOSFET.

12. An output circuit according to claim 9, wherein said short-circuit means further includes a fourth MOSFET which has a source-drain path coupled between the gate of said first output MOSFET and the first power source line and which is temporarily held in a transferring state at an initial state of a process in which said first output MOSFET is turned on so that a level change of a voltage on the gate of said first output MOSFET is made at predetermined slow rate,
wherein said first and second power source voltage lines are supplied with a power source voltage and a ground potential of circuitry including said output circuitry, respectively,
wherein said first MOSFET is a P-channel MOSFET, and
wherein said fourth MOSFET is of P-channel type and has a gate of which receives a fourth signal a level of which is set to a low level to a high level from a low level while a level of the first signal is set to a low level from a high level.

13. An output circuit according to claim 12, wherein said fourth MOSFET has a conductance ratio with which a gate voltage of said first MOSFET is raised to a predetermined level when said fourth MOSFET is turned "on" along with said first MOSFET, relative to an N-channel MOSFET which constitutes a driver circuit disposed at a stage preceding said gate of said first MOSFET.

14. An output circuit comprising:
an output terminal;
an output MOSFET having a source-drain path which is interposed between said output terminal and a power source voltage terminal;
first current feed means coupled to a gate of said output MOSFET and responsive to a first control signal for supplying the gate of said output MOSFET with a first current in order to control a gate voltage of said output MOSFET; and
second current feed means coupled to the gate of said output MOSFET and responsive to a second control signal for supplying said gate with a second current different in phase from the first current;
an operating period of said first current feed means and that of said second current feed means overlapping at least partly, whereby the gate voltage of said output MOSFET is determined so that a conductance of said output MOSFET is temporarily lowered.

15. An output circuit according to claim 14, wherein said second current feed means comprises a MOSFET, a source-drain of which is coupled between said output terminal and said gate.

16. An output circuit according to claim 14, wherein said second current feed means comprises a MOSFET, a source-drain of which is coupled between said output terminal and said power source voltage terminal.

17. A semiconductor integrated circuit according to claim 16, further comprising:
a plurality of external terminals, each being coupled to one of the output terminals of said plurality of output circuits; and an external power supply terminal to which the second terminals of said plurality of output circuits are connected in common.

18. A semiconductor integrated circuit including a plurality of output circuits, each output circuit comprising:
   an input terminal to which an input signal is applied;
   an output terminal to which an output signal is applied;
   first and second terminals to which first and second power supply voltages are supplied, respectively, said first power supply voltage being greater than said second power supply voltage;
   a first output MOSFET coupled to have its source-drain path coupled between said first terminal and said output terminal;
   a second output MOSFET coupled to have its source-drain path coupled between said output terminal and said second terminal;
   a driver circuit coupled to have an input coupled to said input terminal, a first output coupled to a gate of said first output MOSFET and a second output coupled to a gate of said second output MOSFET, wherein said driver circuit controls operations of said first and second output MOSFET's in a push-pull mode in response to the input signal; and
   a feedback circuit including at least one MOSFET coupled to have its source-drain path coupled between said output terminal and the gate of one of said first and second output MOSFETs,
   wherein the MOSFET in said feedback circuit is selectively turned on when one of said first and second output MOSFETs is turned on, whereby a gate potential on the gate of the one of said first and second output MOSFETs is controlled so that a level change of the output signal is made gentle.

19. In a digital processor formed in a semiconductor substrate and including an arithmetic/logic circuit for subjecting data to a predetermined operation process, a plurality of output circuits coupled to outputs of the arithmetic/logic circuit for delivering output data of the arithmetic/logic circuit to external data output terminals and an external power supply terminal, each output circuit comprising:
   an input terminal coupled to one of the outputs of said arithmetic/logic circuit;
   an output terminal coupled to one of said external data output terminals;
   a first power source terminal to which a first power source voltage is supplied;
   a second power source terminal which is coupled to said external power supply terminal and to which a second power source voltage is supplied;
   a first output MOSFET coupled to have its source-drain path coupled between said first terminal and said output terminal;
   a second output MOSFET coupled to have its source-drain path coupled between said output terminal and said second terminal;
   a driver circuit coupled to have an input coupled to said input terminal, a first output coupled to a gate of said first output MOSFET and a second output coupled to a gate of said second output MOSFET, wherein said driver circuit controls operations of said first and second output MOSFETs in a push-pull mode in response to the input signal; and
   a feedback circuit including at least one MOSFET coupled to have its source-drain path coupled between said output terminal and the gate of one of said first and second output MOSFETs,
   wherein the MOSFET in said feedback circuit is selectively turned on when the one of said first and second output MOSFETs is turned on, whereby a gate potential on the gate of the one of said first and second output MOSFETs is controlled so that a level change of the output signal is made gentle.

20. An output circuit comprising:
   a first output MOSFET which is interposed between an output terminal and a first power source voltage,
   a second output MOSFET which is interposed between said output terminal and a second power source voltage, and
   a feedback circuit which is interposed between said output terminal and a gate of said second output MOSFET,
   wherein said feedback circuit is temporarily held in a transferring state at an initial stage of a process in which said second output MOSFET is turned on, and
   wherein said feedback circuit interposed between said output terminal and said gate of said second output MOSFET is comprised of:
   a third MOSFET which is normally off, and which is turned on before the corresponding second output MOSFET is turned on, and
   a fourth MOSFET which is normally on, and which is turned off after a lapse of a predetermined time since said corresponding second output MOSFET has been turned on,
   said third MOSFET and said fourth MOSFET being connected in series form.

21. An output circuit according to claim 20, wherein:
   said first and second power source voltages are a power source voltage and a ground potential of circuitry including said output circuit, respectively, and
   said second output MOSFET and said third and fourth MOSFETs are N-channel MOSFETs.

22. An output circuit comprising:
   a first output MOSFET which is interposed between an output terminal and a first power source voltage,
   a second output MOSFET which is interposed between said output terminal and a second power source voltage,
   a first feedback circuit which is interposed between said output terminal and a gate of said second output MOSFET, and
   a second feedback circuit which is interposed between said output terminal and a gate of said second output MOSFET,
   wherein said first and second feedback circuits are temporarily held in transferring states at initial stages of processes in which said first and second output MOSFETs corresponding thereto are respectively turned on,
   wherein:
   said first and second power source voltages are a power source voltage and a ground potential of circuitry including said output circuit, respectively,
   said first output MOSFET is a P-channel MOSFET, and
   said second output MOSFET is an N-channel MOSFET, wherein said first feedback circuit is constructed of:
   a third MOSFET which is normally off, and which is turned on before the corresponding first output MOSFET is turned on, and
   a fourth MOSFET which is normally on, and which is turned of after a lapse of a predetermined time since said corresponding first output MOSFET has been turned on,
   said third MOSFET and said fourth MOSFET being connected in series form,
and further wherein said second feedback circuit is comprised of:
   a fifth MOSFET which is normally off, and which is turned on before the corresponding second output MOSFET is turned on, and
   a sixth MOSFET which is normally on, and which is turned off after a lapse of a predetermined time since said corresponding second output MOSFET has been turned on,
   said fifth MOSFET and said sixth MOSFET being connected in series form.

23. An output circuit according to claim 22, wherein:
said third and fourth MOSFETs are P-channel MOSFETs, and
said fifth and sixth MOSFETs are N-channel MOSFETs.

* * * * *